(12) United States Patent
Yonezawa et al.

(10) Patent No.: US 7,262,640 B2
(45) Date of Patent: Aug. 28, 2007

(54) VOLTAGE-FREQUENCY CONVERSION APPARATUS

(75) Inventors: Yoshiaki Yonezawa, Gunma (JP); Tadao Senriuchi, Chiba (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/332,516

(22) Filed: Jan. 17, 2006

(65) Prior Publication Data

US 2006/0170463 A1     Aug. 3, 2006

(30) Foreign Application Priority Data

Jan. 18, 2005  (JP)  ............................. 2005-010926

(51) Int. Cl.
*H03C 3/00*   (2006.01)
(52) U.S. Cl. ........................ 327/101; 327/100
(58) Field of Classification Search ................ 327/100, 327/101, 530, 531
See application file for complete search history.

(56) References Cited

U.S. PATENT DOCUMENTS

| 4,047,056 | A | * | 9/1977 | Nakagawa | ................... 327/101 |
| 4,316,155 | A | * | 2/1982 | Hanisko | ....................... 331/18 |
| 6,169,428 | B1 | * | 1/2001 | Mader | ......................... 327/101 |
| 6,653,872 | B2 | * | 11/2003 | MacGugan | ................. 327/101 |
| 7,061,296 | B2 | * | 6/2006 | Friedrich et al. | ........... 327/299 |

FOREIGN PATENT DOCUMENTS

JP     2002-107428     4/2002

* cited by examiner

*Primary Examiner*—Kenneth B. Wells
*Assistant Examiner*—Hai L. Nguyen
(74) *Attorney, Agent, or Firm*—Fish & Richardson P.C.

(57) ABSTRACT

A voltage-frequency conversion apparatus which has a variable current source for charging a capacitor; a current amount adjustment unit that adjusts a current amount of the variable current source for charging the capacitor to be corresponding to a differential voltage between a first voltage and a second voltage; a comparator that compares in level a charging voltage produced at one end of the capacitor and a reference voltage; a discharge unit that discharges the charging voltage of the capacitor according to the comparison result of the comparator when the charging voltage exceeds the reference voltage; and a reference voltage fluctuation unit that makes the reference voltage fluctuate. A frequency signal is generated from the comparator corresponding to the differential voltage between the first voltage and the second voltage.

6 Claims, 5 Drawing Sheets

--PRIOR ART--

VOLTAGE-FREQUENCY CONVERSION APPARATUS

CROSS-REFERENCE TO RELATED APPLICATIONS

The present application claims priority from Japanese Patent Application No. 2005-10926 filed on Jan. 18, 2005, which is herein incorporated by reference.

BACKGROUND OF THE INVENTION

1. Field of the Invention

The present invention relates to a voltage-frequency conversion apparatus and a method of generating a reference voltage of the voltage-frequency conversion apparatus, which are suitable for detecting the remaining voltage of electricity charged in a secondary battery, for example.

2. Description of the Related Art

==Configuration of Conventional Voltage-Frequency Conversion Apparatus==

<Overall Configuration>

Figure 3:
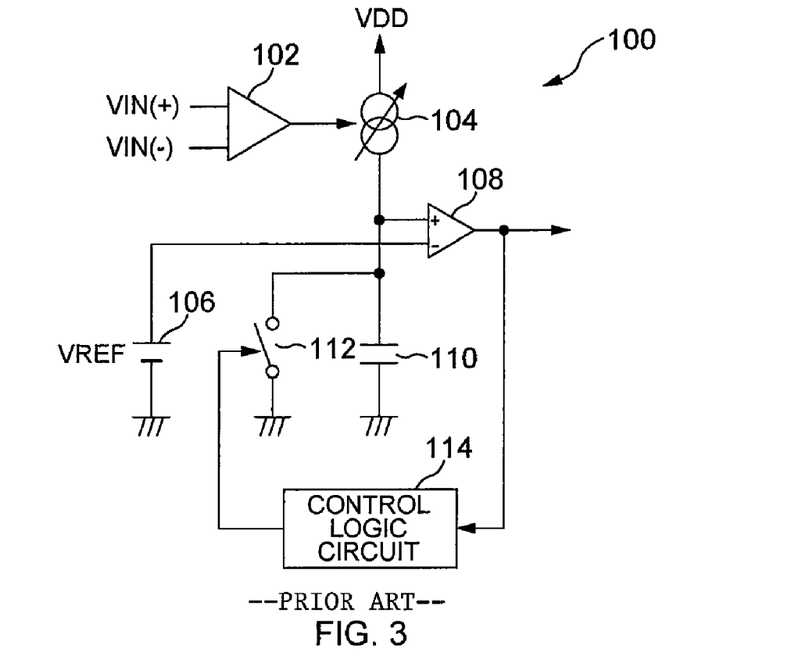
FIG. 3 is a circuit block diagram showing a conventional voltage-frequency conversion apparatus.

With reference to FIG. 3, an example configuration of a conventional voltage-frequency conversion apparatus is described. FIG. 3 is a circuit block diagram showing the example configuration of the conventional voltage-frequency conversion apparatus.

A voltage-frequency conversion apparatus 100 shown in FIG. 3 has an error amplifier 102, a variable current source 104, a reference voltage source 106, a comparator 108, a capacitor 110, a switch element 112 and a control logic circuit 114.

The error amplifier 102 is applied with a voltage VIN(+) and a voltage VIN(−) and generates an output voltage corresponding to a differential voltage (an error) between the voltage VIN(+) and the voltage VIN(−). In other words, the greater the difference between the voltage VIN(+) and the voltage VIN(−) is, the larger the output voltage generated by the error amplifier 102 becomes.

A current amount generated by the variable current source 104 is controlled according to the output voltage of the error amplifier 102. In other words, the larger the output voltage of the error amplifier 102 is, the larger the current generated by the variable current source 104 becomes. The variable current source 104 and the capacitor 110 are serially connected between a power source VDD and ground, and the capacitor 110 is charged with the current generated by the variable current source 104. In other words, the larger the current generated by the variable current source 104 is, the faster the capacitor 110 is charged and, on the other hand, the smaller the current generated by the variable current source 104 is, the slower the capacitor 110 is charged.

The comparator 108 compares a charging voltage occurring at one end of the capacitor 110 on the non-grounded side and a constant reference voltage VREF generated by the reference voltage source 106. In FIG. 3, the charging voltage of the capacitor 110 is applied to a plus (non-inverting input) terminal of the comparator 108 and the reference voltage VREF is applied to a minus (inverting input) terminal of the comparator 108. Therefore, the comparator 108 outputs a low level if the charging voltage of the capacitor 110 is smaller than the reference voltage VREF and outputs a high level if the charging voltage of the capacitor 110 exceeds the reference voltage VREF. In other words, the comparator 108 outputs a frequency signal corresponding to the differential voltage between the voltage VIN(+) and the voltage VIN(−).

The switch element 112 is connected in parallel with the capacitor 110. A bipolar transistor, a MOSFET, etc. can be employed as the switch element 112.

The control logic circuit 114 is connected to the output of the comparator 108 and controls the turning on/off of the switch element 112. In other words, the control logic circuit 114 renders the switch element 112 on for a certain period after the output of the comparator becomes a high level. In this period, the capacitor 110 is discharged through the switch element 112.

==Operation of Conventional Voltage-Frequency Conversion Apparatus==

Figure 6:
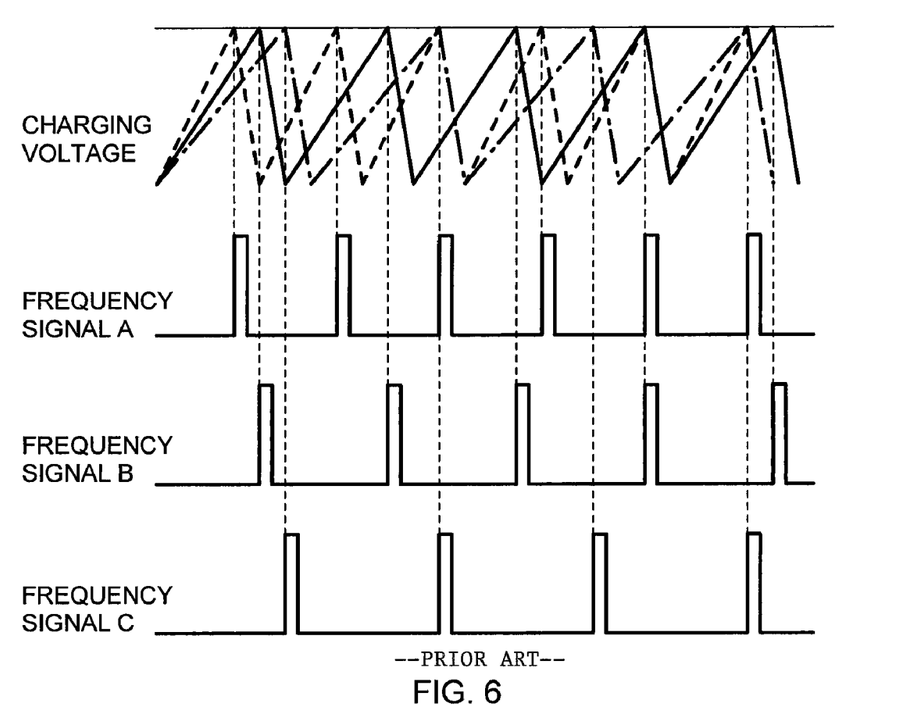
FIG. 6 is a time chart showing the operation of the conventional voltage-frequency conversion apparatus.

With reference to FIG. 3 and FIG. 6, the operation of the voltage-frequency conversion apparatus 100 is described. FIG. 6 is a waveform diagram showing a relationship between the charging voltage appearing at one end of the capacitor 110 and a frequency signal output from the comparator 108. A rate (gradient) of increase in the charging voltage of the capacitor 110 varies depending on the amount of the current supplied from the variable current source 104. In other words, as the current supplied from the variable current source 104 becomes smaller, the gradient of increase in the charging voltage of the capacitor 110 changes from a dashed line to a solid line to a dot-and-dash line in the direction of becoming more gradual. Frequency signals A, B, C are signals generated respectively corresponding to the charging voltages indicated by the dashed line, the solid line and the dot-and-dash line.

If the differential voltage between the voltage VIN(+) and the voltage VIN(−) equals VA, the variable current source 104 generates a current IA and the capacitor 110 is supplied with the current IA and charged as shown by the dashed line. If the charging voltage of the capacitor 110 is smaller than the reference voltage VREF, the output of the comparator 108 is at a low level. If the charging voltage of the capacitor 110 exceeds the reference voltage VREF subsequently, the output of the comparator 108 becomes a high level. The control logic circuit 114 renders the switch element 112 on for a certain period after the output of the comparator 108 becomes the high level. In other words, a discharge path is formed for the capacitor 110. Therefore, the capacitor 110 immediately discharges via the switch element 112, as shown by the dashed line. The certain period in which the control logic circuit 114 renders the switch element 112 on is a time period required for completing the discharge of the capacitor 110 and is decided in consideration of the capacity of the capacitor 110, etc. and preset in the control logic circuit 114. If the charging voltage of the capacitor 110 becomes smaller than the reference voltage VREF, the output of the comparator 108 becomes the low level again. Thus, the comparator 108 outputs the frequency signal A in response to the charging voltage indicated by the dashed line.

If the differential voltage between the voltage VIN(+) and the voltage VIN(−) equals VB (<VA), the variable current source 104 generates a current IB (<IA) and the capacitor 110 is supplied with the current IB and charged as shown by the solid line. If the charging voltage of the capacitor 110 is smaller than the reference voltage VREF, the output of the comparator 108 is at the low level. If the charging voltage of the capacitor 110 exceeds the reference voltage VREF subsequently, the output of the comparator 108 becomes the high level. The control logic circuit 114 renders the switch element 112 on for a certain period after the output of the comparator 108 becomes the high level. Therefore, the capacitor 110 immediately discharges via the switch element 112, as shown by the solid line. If the charging voltage of the capacitor 110 becomes smaller than the reference voltage VREF, the output of the comparator 108 becomes the low level again. Thus, the comparator 108 outputs the frequency signal B in response to the charging voltage indicated by the solid line.

If the differential voltage between the voltage VIN(+) and the voltage VIN(−) equals VC (<VB), the variable current source 104 generates a current IC (<IB) and the capacitor 110 is supplied with the current IC and charged as shown by the dot-and-dash line. If the charging voltage of the capacitor 110 is smaller than the reference voltage VREF, the output of the comparator 108 is at a low level. If the charging voltage of the capacitor 110 exceeds the reference voltage VREF subsequently, the output of the comparator 108 becomes the high level. The control logic circuit 114 renders the switch element 112 on for a certain period after the output of the comparator 108 becomes the high level. Therefore, the capacitor 110 immediately discharges via the switch element 112, as shown by the dot-and-dash line. If the charging voltage of the capacitor 110 becomes smaller than the reference voltage VREF, the output of the comparator 108 becomes the low level again. Thus, the comparator 108 outputs the frequency signal C in response to the charging voltage indicated by the dot-and-dash line.

As described above, the voltage-frequency conversion apparatus 100 converts the differential voltage between the voltage VIN(+) and the voltage VIN(−) to a frequency signal corresponding to the differential voltage.

==Example Application of Voltage VIN(+) and Voltage VIN(−)==

The voltage-frequency conversion apparatus 100 can be employed as an apparatus for determining the remaining voltage of electricity charged in a secondary battery for example.

Figure 4:
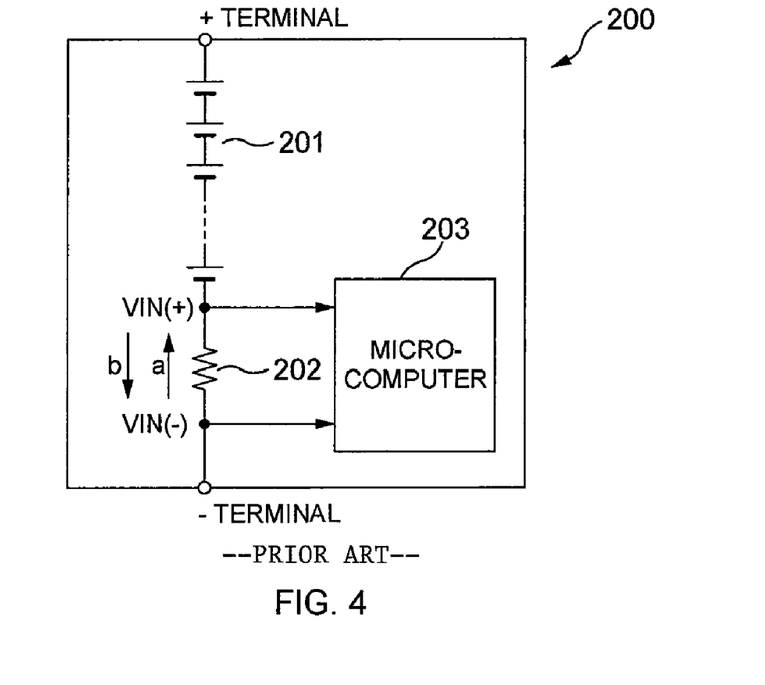
FIG. 4 is a circuit block diagram showing a battery pack which is an example application of the voltage-frequency conversion apparatus.

FIG. 4 is a schematic configuration diagram showing a battery pack incorporating a secondary battery. In FIG. 4, a battery pack 200 incorporates a secondary battery 201, a sensing resistor 202, a microcomputer 203 (or a logic integrated circuit), etc. The secondary battery 201 and the sensing resistor 202 are serially connected between a plus terminal and a minus terminal to be electrically connected to an electronic device using the secondary battery 201 as a power source. When the secondary battery 201 is charged or discharged, the sensing resistor 202 produces the voltage VIN(+) and the voltage VIN(−) at both its ends. For example, if the battery pack 200 is mounted in an electronic device, the secondary battery 201 discharges to supply power to the electronic device and a discharging current flows in an a direction (upwards on the page) through the sensing resistor 202. In other words, when the secondary battery 201 discharges, the voltage VIN(+) becomes lower than the voltage VIN(−). The smaller the discharging amount of the second battery 201 is, the greater the differential voltage between the voltage VIN(+) and the voltage VIN(−) becomes. On the other hand, if the battery pack 200 is mounted on a charger (not shown), the secondary battery 201 is charged and a charging current flows in a b-direction (downwards on the page) through the sensing resistor 202. In other words, when the secondary battery 201 is charged, the voltage VIN(+) becomes higher than the voltage VIN(−). The larger the charging amount of the second battery 201 is, the greater the differential voltage between the voltage VIN(+) and the voltage VIN(−) becomes.

The voltage VIN(+) and the voltage VIN(−) are supplied to the microcomputer 203 as voltage information which is the basis for determining the remaining voltage of electricity when the secondary battery 201 discharges or the charging voltage when the secondary battery 201 is charged. The microcomputer 203 incorporates the voltage-frequency conversion apparatus 100. Hence, the microcomputer 203 can obtain a frequency signal corresponding to the levels of the voltage VIN(+) and the voltage VIN(−) as well as the differential voltage between the voltage VIN(+) and the voltage VIN(−). The microcomputer 203 performs appropriate program processing on the obtained frequency signal, thereby obtaining the remaining voltage of electricity and the usable time for the remaining voltage of electricity when the secondary battery 201 is mounted on an electronic device, and the charging voltage while being charged (see, e.g., Japanese Patent Application Laid-Open Publication No. 2002-107428).

Figure 5:
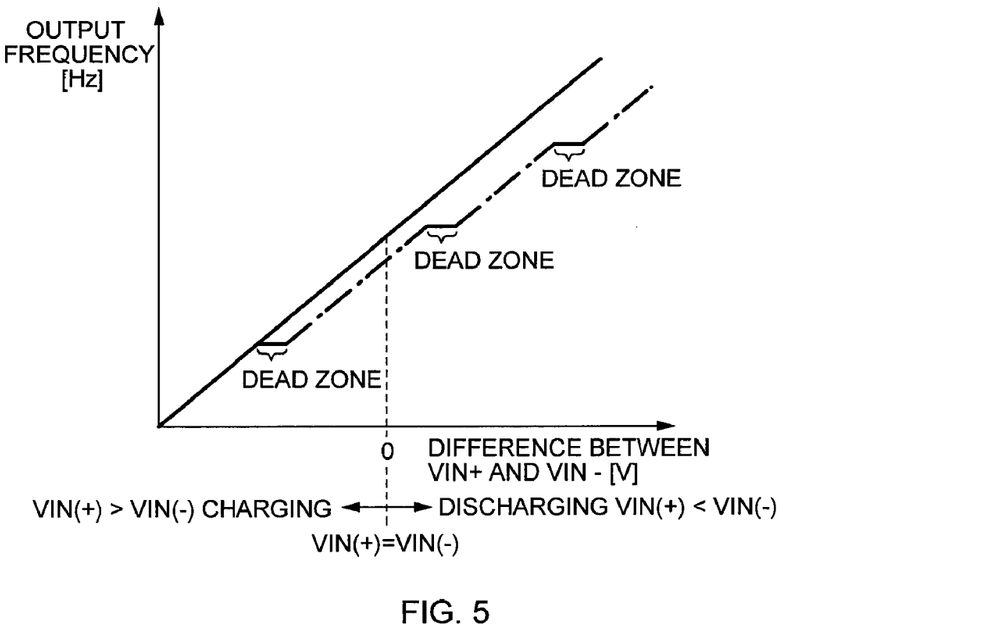
FIG. 5 is a graph showing the input-output characteristic of a voltage-frequency conversion apparatus.

FIG. 5 is a graph showing an input-output characteristic of a voltage-frequency conversion apparatus. In FIG. 5, the horizontal axis shows a differential voltage [V] between the voltage VIN(+) and the voltage VIN(−) input into the error amplifier 102 and the vertical axis shows the frequency [Hz] of the frequency signal output from the comparator 108. The differential voltage [V] between the voltage VIN(+) and the voltage VIN(−) and the frequency signal ideally has proportionality as shown by the solid line.

By the way, the microcomputer 203 (or a logic integrated circuit) executes calculation operation in synchronization with its own or external clock signal. In the case of FIG. 4, the voltage-frequency conversion apparatus 100 is incorporated in the microcomputer 203 to operate, as described above. Therefore, if a predetermined relationship exists between the frequency of the frequency signal output by the comparator 108 in the voltage-frequency conversion apparatus 100 and the frequency of the clock signal used by the microcomputer 203, the former frequency signal receives interference (digital noises) from the latter clock signal. The predetermined relationship is, for example, that the frequency of the former frequency signal is an integral multiple of the frequency of the latter clock signal. This can happen because the frequency of the frequency signal is a unique constant frequency depending on a charging voltage of the capacitor 110. If the former frequency signal is subject to interference from the latter clock signal, the frequency of the frequency signal output by the comparator 108 becomes constant without responding to the change in the differential voltage between the voltage VIN(+) and the voltage VIN(−). In other words, if being subject to interference from the clock signal, the voltage-frequency conversion apparatus 100 has a dead zone where the change in the frequency signal is constrained. As a result, the problem occurs that the actual input-output characteristic of the voltage-frequency conversion apparatus 100 deviates from the real input-output characteristic indicated by the solid line to one indicated by a dot-and-dash line.

The problem of interference between the voltage-frequency conversion apparatus 100 and the clock signal occurs not only in the case that the voltage-frequency conversion apparatus 100 is incorporated in the microcomputer 203, the logic integrated circuit, etc., but for example, even if the voltage-frequency conversion apparatus 100 and a circuit using the clock signal having a predetermined frequency such as an integrated circuit or a discreet circuit are provided separately, the interference problem may occur in a design environment where the clock signal is a disturbance factor for the voltage-frequency conversion apparatus 100.

If the voltage-frequency conversion apparatus 100 has the input-output characteristic as shown by the dot-and-dash line of FIG. 5, the microcomputer 203 obtains a remaining voltage of electricity greater than a real remaining voltage of electricity as the remaining voltage of the secondary battery 201, for example, where the battery pack 200 is mounted in an electronic device. In this case, if the microcomputer 203 displays the remaining voltage of the secondary battery 201 on a display of the electronic device, the remaining voltage of the secondary battery 201 may suddenly become zero when the display status is suggesting that the remaining voltage of the secondary battery 201 is sufficient, resulting in a shutdown of the electronic device, which gives a user so much trouble.

SUMMARY OF THE INVENTION

It is therefore an object of the present invention to provide a voltage-frequency conversion apparatus which can maintain good voltage-frequency conversion accuracy even if periodic digital noise exists as a disturbance factor.

In order to achieve the above and other objects, according to one aspect of the present invention there is provided a voltage-frequency conversion apparatus which has a variable current source for charging a capacitor; a current amount adjustment unit that adjusts a current amount of the variable current source for charging the capacitor to be corresponding to a differential voltage between a first voltage and a second voltage; a comparator that compares in level a charging voltage produced at one end of the capacitor and a reference voltage; a discharge unit that discharges the charging voltage of the capacitor according to the comparison result of the comparator when the charging voltage exceeds the reference voltage; and a reference voltage fluctuation unit that makes the reference voltage fluctuate. A frequency signal is generated from the comparator corresponding to the differential voltage between the first voltage and the second voltage.

Also, there is provided a method of generating a reference voltage for a voltage-frequency conversion apparatus which has a variable current source for charging a capacitor; a current amount adjustment unit that adjusts a current amount of the variable current source for charging the capacitor to be corresponding to a differential voltage between a first voltage and a second voltage; a comparator that compares in level a charging voltage produced at one end of the capacitor and a reference voltage; and a discharge unit that discharges a charging voltage of the capacitor according to the comparison result of the comparator when the charging voltage exceeds the reference voltage. A frequency signal is generated from the comparator corresponding to the differential voltage between the first voltage and the second voltage. The method comprises making the reference voltage fluctuate periodically within a predetermined voltage range.

According to the present invention, the voltage-frequency conversion accuracy can be improved.

BRIEF DESCRIPTION OF THE DRAWINGS

The above and other objects, aspects, features and advantages of the present invention will become more apparent from the following detailed description when taken in conjunction with the accompanying drawings, in which.

DETAILED DESCRIPTION OF THE INVENTION

From description of the specification and the accompanying drawings, at least the following matters will become apparent.

==Configuration of Voltage-Frequency Conversion Apparatus== <Overall Configuration>

Figure 1:
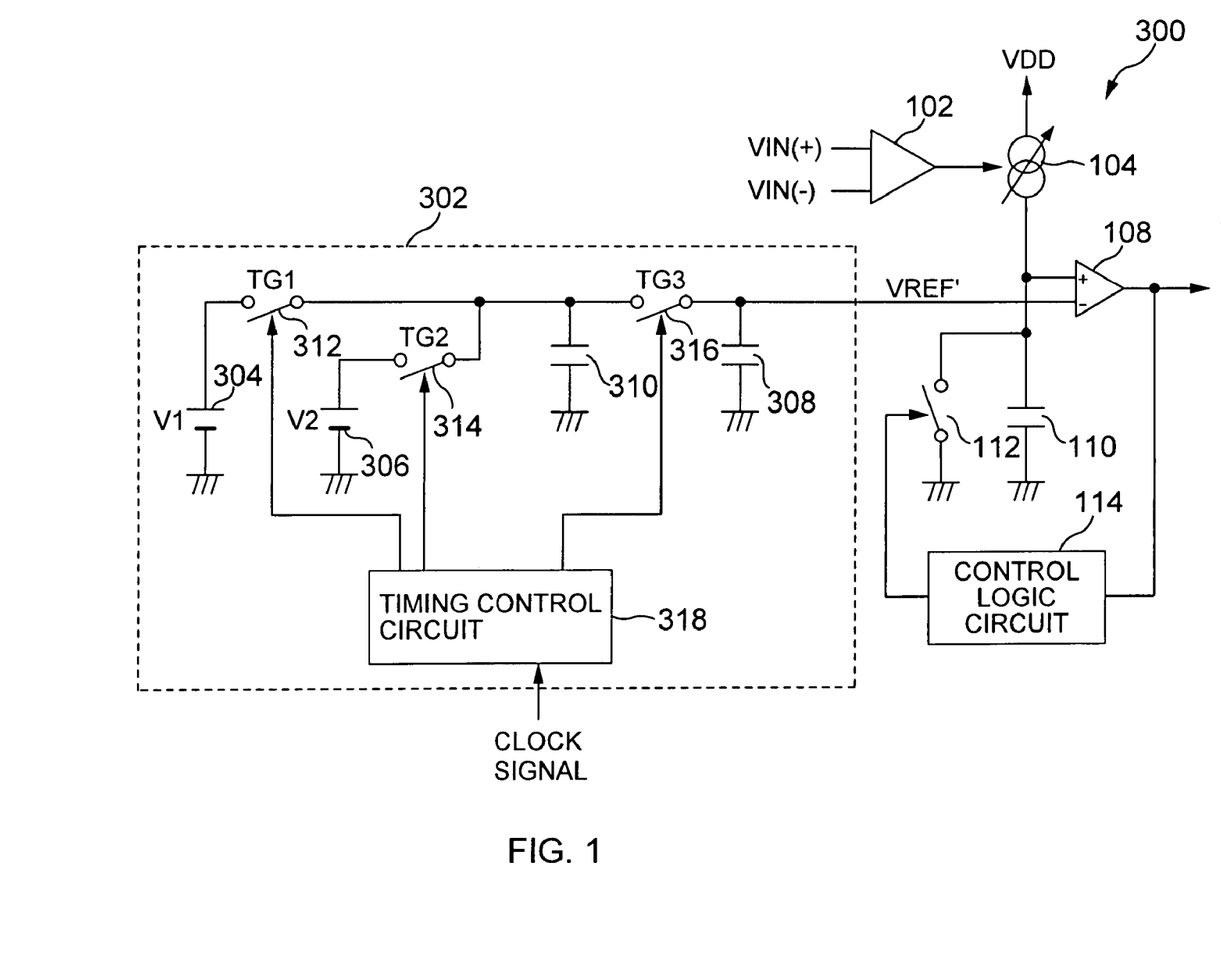
FIG. 1 is a circuit block diagram showing a voltage-frequency conversion apparatus according to the present invention.

With reference to FIG. 1, an example configuration of a voltage-frequency conversion apparatus of the present invention is described. FIG. 1 is a circuit block diagram showing an example configuration of the voltage-frequency conversion apparatus according to the present invention. In the configuration of FIG. 1, the same or like parts as in FIG. 3 are denoted by the same reference numerals and a description thereof is omitted.

A voltage-frequency conversion apparatus 300 shown in FIG. 1 has an error amplifier 102 (a current amount adjustment unit), a variable current source 104, a reference voltage fluctuation unit 302, a comparator 108 (a comparison unit), a capacitor 10, a switch element 112 and a control logic circuit 114. The configuration of FIG. 1 is different from the configuration of FIG. 3 in that instead of the reference voltage source 106 generating a constant reference voltage VREF, the reference voltage fluctuation unit 302 is provided which generates a reference voltage VREF' repeating fluctuation at a constant cycle. The switch element 112 and the control logic circuit 114 correspond to a discharge unit of the present invention.

The comparator 108 compares a charging voltage occurring at one end on the non-grounded side of the capacitor 110 and the reference voltage VREF' repeating fluctuation at a constant cycle generated by the reference voltage fluctuation unit 302. In FIG. 1, the charging voltage of the capacitor 110 is applied to a plus (non-inverting input) terminal of the comparator 108 and the reference voltage VREF' is applied to a minus (inverting input) terminal of the comparator 108. Therefore, the comparator 108 outputs a low level if the charging voltage of the capacitor 110 is smaller than the reference voltage VREF' and outputs a high level if the charging voltage of the capacitor 110 exceeds the reference voltage VREF'. In other words, the comparator 108 outputs a frequency signal corresponding to the differential voltage between the voltage VIN(+) and the voltage VIN(−) and the reference voltage VREF'.

<Configuration of Reference Voltage Fluctuation Unit>

The reference voltage fluctuation unit 302 has a first reference voltage source 304, a second reference voltage source 306, a first capacitor 308, a second capacitor 310, a first switch element 312 (TG1), a second switch element 314 (TG2), a third switch element 316 (TG3) and a timing control circuit 318. The first reference voltage source 304 generates a voltage V1. The second reference voltage source 306 generates a voltage V2 (<voltage V1). The capacitance value of the first capacitor 308 is set to be greater than that of the second capacitor 310. The first switch element 312 is connected between one end on the non-grounded side of the first reference voltage source 304 generating the voltage V1 and one end on the non-grounded side of the second capacitor 310 producing a charging/discharging voltage. The second switch element 314 is connected between one end on the non-grounded side of the second reference voltage source 306 generating the voltage V2 and one end on the non-grounded side of the second capacitor 310. The third switch element 316 is connected between one end on the non-grounded side of the first capacitor 308 producing a charging/discharging voltage and one end on the non-grounded side of the second capacitor 310. The charging/discharging voltage produced at the non-grounded side end of the first capacitor 308 is applied to the minus terminal of the comparator 108 as the reference voltage VREF'. The timing control circuit 318 performs the switching control for the first switch element 312, the second switch element 314 and the third switch element 316 such that the charging/discharging voltage produced at the one end of the first capacitor 308 periodically changes between the voltage V1 and the voltage V2. Especially, in the timing control circuit 318, hardware logic is formed which generates control signals for turning on/off the first switch element 312, the second switch element 314 and the third switch element 316 respectively at predetermined timings based on a clock signal supplied from the microcomputer 203. In accordance with the timing control by the timing control circuit 318, the first switch element 312 and the second switch element 314 are turned on/off complementarily at a first cycle T1 and the third switch element 316 is turned on/off at a second cycle T2 (<first cycle T1). A bipolar transistor, a MOSFET, etc., can be employed as the first to third switches 312, 314, 316.

The first switch element 312 and the third switch element 316 act as a first switch circuit for charging to increase the reference voltage VREF' occurring at the one end of the first capacitor 308 from the voltage V2 side to the voltage V1 side. On the other hand, the second switch element 314 and the third switch element 316 act as a second switch circuit for discharging to decrease the reference voltage VREF' occurring at the one end of the first capacitor 308 from the voltage V1 side to the voltage V2 side.

==Operation of Voltage-Frequency Conversion Apparatus==

<Operation of Reference Voltage Fluctuation Unit>

Figure 2:
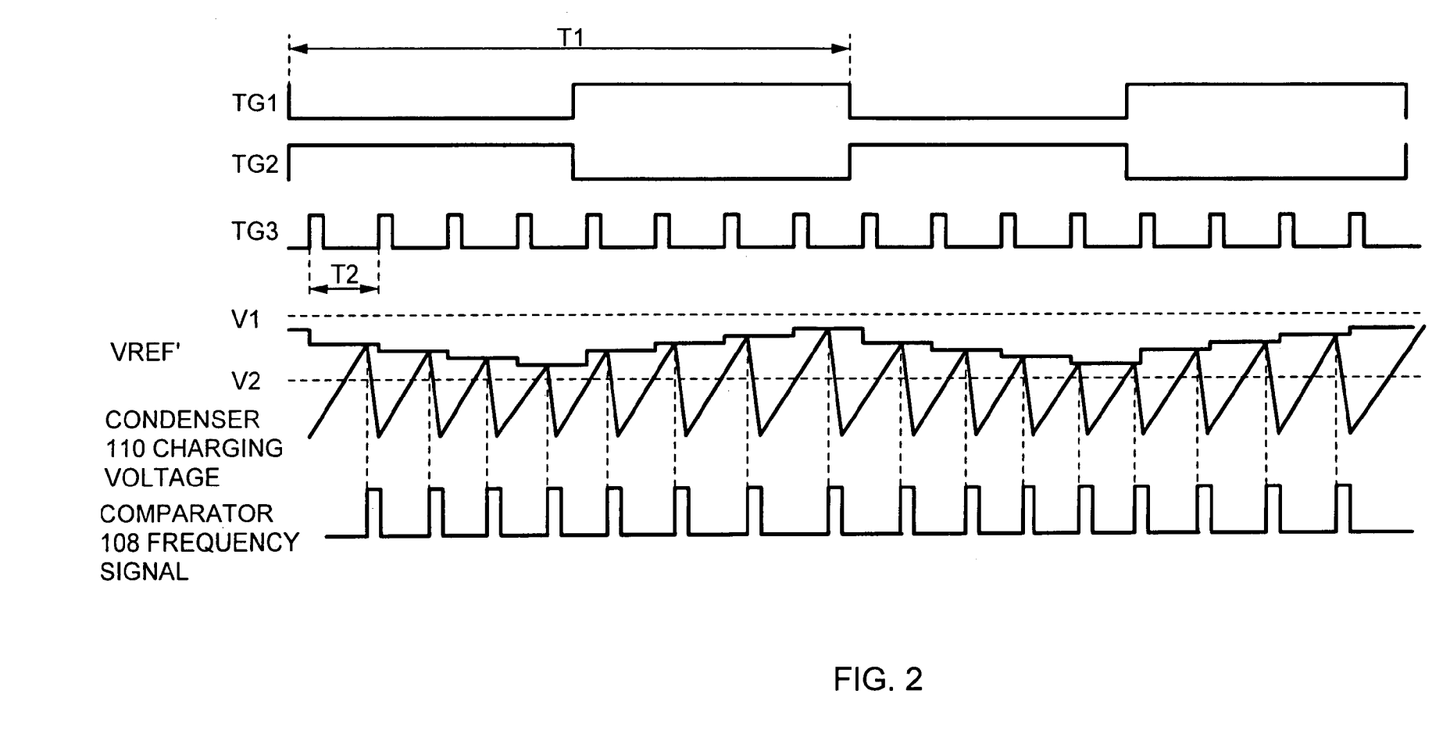
FIG. 2 is a time chart showing the operation of the voltage-frequency conversion apparatus according to the present invention.

With reference to FIG. 1 and FIG. 2, description will be made of operation of the reference voltage fluctuation unit 302 generating the reference voltage VREF' fluctuating periodically. FIG. 2 is a timing chart showing the operation of the voltage-frequency conversion apparatus. In FIG. 2, the high levels of TG1 to TG3 denoting the first to third switch elements 312, 314, 316 indicate the on-states of the first to third switch elements 312, 314, 316 respectively, and the low levels of TG1 to TG3 indicate the off-states of the first to third switch elements 312, 314, 316 respectively.

First, in a steady state of the reference voltage fluctuation unit 302, if the first switch element 312 is off and the second switch element 314 is on, a voltage produced at the non-grounded side end of the second capacitor 310 changes from the higher voltage V1 to the lower voltage V2. Therefore, in a T1/2 period in which the first switch element 312 is off and the second switch element 314 is on, each time the third switch element 316 is turned on at the second cycle T2, of the charging voltage of the first capacitor 308 an amount depending on the capacitance of the second capacitor 310 is transferred to the second capacitor 310. As a result, each time the third switch element is turned on, the reference voltage VREF' produced at the non-grounded side end of the first capacitor 308 is decreased stepwise from the voltage V1 side to the voltage V2 side.

In a steady state of the reference voltage fluctuation unit 302, if the first switch element 312 is on and the second switch element 314 is off, a voltage produced at the non-grounded side of the second capacitor 310 changes from the lower voltage V2 to the higher voltage V1. Therefore, in a T1/2 period when the first switch element 312 is on and the second switch element 314 is off, each time the third switch element 316 is turned on at the second cycle T2, of the charging voltage of the second capacitor 310 an amount depending on the capacitance of the second capacitor 310 is transferred to the first capacitor 308. As a result, each time the third switch element is turned on, the reference voltage VREF' produced at the non-grounded side end of the first capacitor 308 is increased stepwise from the voltage V2 side to the voltage V1 side.

In accordance with the switch control of the timing control circuit 318 for the first and third switch elements 12, 314, 316, the non-grounded side end of the first capacitor produces the reference voltage VREF' repeatedly decreasing and increasing at the first cycle T1. Therefore, unlike the reference value VREF, the reference voltage VREF' is not a constant value.

In the implementation, the first cycle T1 and the second cycle T2 are described as having a relationship of "T1=8× T2", the present invention is not limited to this. The second cycle T2 may be further shortened relative to the first cycle T1. In this case, each period of the reference voltage VREF' changing stepwise between the voltage V1 and the voltage V2 becomes shorter than in FIG. 2 and each stepwise-changing amount (each level) of the reference voltage VREF' becomes smaller than in FIG. 2. In other words, the reference voltage VREF' fluctuates more frequently than in FIG. 2.

<Overall Operation>

With reference to FIG. 1 and FIG. 2, the operation of the voltage-frequency conversion apparatus of the present invention is described. In FIG. 2, the gradient of increase in the charging voltage of the capacitor 110 changes in the direction of becoming more gradual as the current supplied from the variable current source 104 becomes smaller. The current amount of the variable current source 104 is uniquely decided according to the differential voltage between the voltage VIN(+) and the voltage VIN(−). Therefore, the frequency of the frequency signal output from the comparator 108 is uniquely decided according to the differential voltage between the voltage VIN(+) and the voltage VIN(−). In the implementation, a description is made of a period when the differential voltage between the voltage VIN(+) and the voltage VIN(−) is approximately constant.

For example, if the differential voltage between the voltage VIN(+) and the voltage VIN(−) is VX, the variable current source 104 generates a current IX and the capacitor 110 is supplied with the current IX and charged as shown by the solid line. If the charging voltage of the capacitor 110 is smaller than the reference voltage VREF', the output of the comparator 108 is at the low level. If the charging voltage of the capacitor 110 exceeds the reference voltage VREF' subsequently, the output of the comparator 108 becomes the high level. The control logic circuit 114 turns on the switch element 112 for a certain period after the output of the comparator 108 becomes the high level. In other words, a discharge path is formed for the capacitor 110. Therefore, the capacitor 110 immediately discharges via the switch element 112, as shown by the solid line. The certain period in which the control logic circuit 114 renders the switch element 112 on is a period required for completing the discharge of the capacitor 110 and is decided in consideration of the capacity of the capacitor 110, etc., and preset in the control logic circuit 114. If the charging voltage of the capacitor 110 becomes smaller than the reference voltage VREF', the output of the comparator 108 becomes the low level again. Therefore, the comparator 108 outputs the frequency signal of FIG. 2.

In the implementation, the reference voltage VREF' periodically changes between the voltage V1 and the voltage V2. In other words, even in the period when the gradient of the increase in the charging voltage of the capacitor 110 is approximately constant, since a comparison target of the charging voltage, i.e., the level of the reference voltage VREF' periodically changes, the frequency of the frequency signal output from the comparator 108 is not approximately constant and varies.

Therefore, if the voltage-frequency conversion apparatus 300 is built in the microcomputer 203 or a logic integrated circuit that operates with the use of the clock signal as shown in FIG. 4, since the frequency of the frequency signal output from the comparator 108 varies, the possibility is extremely low that the frequency signal output from the comparator 108 has a certain relationship with a frequency of periodic digital noise such as the clock signal (e.g., that the frequency of the frequency signal is an integral multiple of that of the clock signal). Therefore, the frequency signal output from the comparator 108 is hardly subject to interference from digital noise such as the clock signal, and a dead zone shown in FIG. 5 hardly occurs. In this way, without considerably deviating from the real linear characteristic indicated by the solid line in FIG. 5 to the characteristic indicated by the dot-and-dash line, the input-output characteristic of the voltage-frequency conversion apparatus 300 of the implementation approximately matches the linear characteristic of the solid line.

Therefore, by employing the voltage-frequency conversion apparatus 300 of the implementation, voltage-frequency conversion accuracy can be improved. Especially, if the voltage-frequency conversion apparatus 300 is used for detecting the remaining voltage of electricity, etc., of the secondary battery 201 of the battery pack 200 shown in FIG. 4, the remaining voltage, etc., can be obtained more accurately.

As the capacity ratio of the first capacitor 308 to the second capacitor 310 becomes greater, each period of the reference voltage VREF' changing stepwise becomes shorter and each stepwise-changing amount (each level) of the reference voltage VREF' becomes smaller. Therefore, in this way, the possibility is further reduced that the frequency signal output from the comparator 108 is subject to interference from periodic digital noise such as the clock signal.

If the voltage-frequency conversion apparatus 300 is used for detecting the charged/discharged state of the secondary battery 201, a relationship between the error amplifier 102 and the variable current source 104 may beset such that when the differential voltage becomes zero between the voltage VIN(+) and the voltage VIN(−) applied to the error amplifier 102, a current supplied from the variable current source 104 to the capacitor 110 is at a predetermined current IO (>0). For example, if the battery pack 200 incorporating the voltage-frequency conversion apparatus 300 is mounted on an electronic device to supply power to the electronic device, the secondary battery 201 discharges. In other words, since the discharging current flows in the a direction of FIG. 4, a relationship that the voltage VIN(+)<the voltage VIN(−) is established and, as the differential voltage between the voltage VIN(+) and the voltage VIN(−) becomes greater, the differential voltage goes to the right from the point of VIN(+)=VIN(−) on the horizontal axis of FIG. 5 and the frequency of the frequency signal output from the comparator 108 becomes higher. On the other hand, if the battery pack 200 incorporating the voltage-frequency conversion apparatus 300 is mounted on a charger, the secondary battery 201 is charged. In other words, since the charging current flows in the b-direction of FIG. 4, a relationship that the voltage VIN(+)>the voltage VIN(−) is established and, as the differential voltage between the voltage VIN(+) and the voltage VIN(−) becomes greater, the differential voltage goes to the left from the point of the voltage VIN(+)=the voltage VIN(−) on the horizontal axis of FIG. 5 and the frequency of the frequency signal output from the comparator 108 becomes lower. The microcomputer 203 can detect the charged/discharged state of the secondary battery 201 based on the levels of the voltage VIN(+) and the voltage VIN(−) and the differential voltage between them with respect to the frequency signal of the comparator at the time when the voltage VIN(+)=the voltage VIN(−).

==Example Application of Battery Pack==

Figure 7:
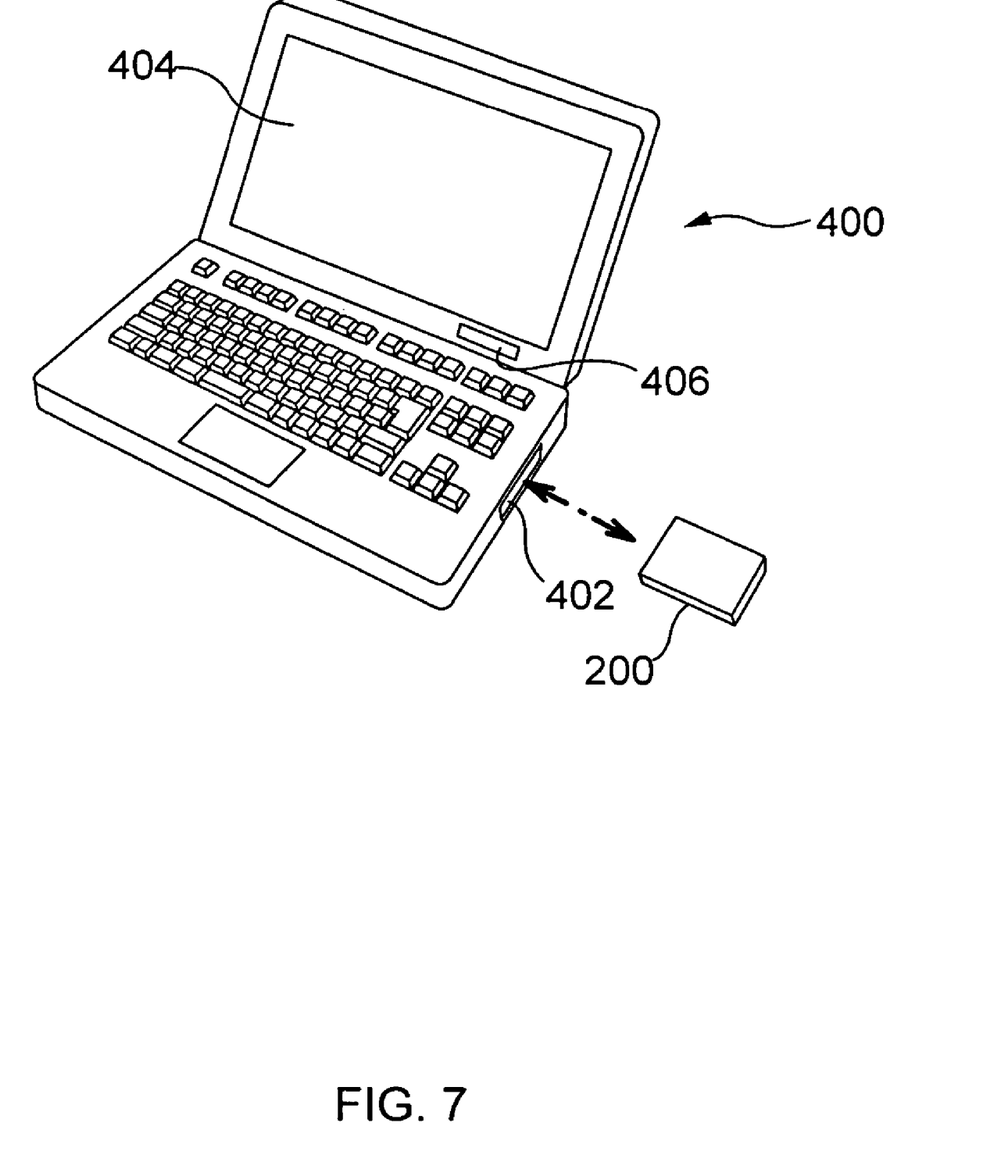
FIG. 7 is a diagram showing an example of an electronic device to which the battery pack has been applied.

The battery pack 200 having the voltage-frequency conversion apparatus 300 of FIG. 1 may be applied to a notebook personal computer 400 shown in FIG. 7, for example. By inserting and loading the battery pack 200 into a battery insert slot 402 provided at the side of the notebook personal computer 400, power can be supplied to allow the notebook personal computer 400 to operate. The remaining voltage (or usable time) of the secondary battery 201 obtained by the microcomputer 203 within the battery pack 203 can be displayed on the edge of the display 404 or on a small display 406 provided exclusively for this purpose. As a method of displaying the remaining voltage of the secondary battery, an indicator display using a bar or a numerical display may be utilized.

The battery pack 200 having the voltage-frequency conversion apparatus 300 may be applied to a digital camera, a cellular phone, etc.

Since voltage-frequency conversion accuracy can be improved by applying the voltage-frequency conversion apparatus 300, the effect of this application is great with any portable electronic devices requiring appropriate voltage-frequency conversion results.

As apparent from the description above, the voltage-frequency conversion apparatus 300 has the variable current source 104 for charging the capacitor 110; the error amplifier 102 for adjusting the current amount of the variable current source 104 for charging the capacitor 110 to be corresponding to the differential voltage between the voltage VIN(+) and the voltage VIN(−); the comparator 108 for comparing in level a charging voltage produced at one end of the capacitor 110 and the reference voltage VREF'; and the discharge unit (the switch element 112 and the control logic circuit 114) for discharging the charging voltage of the capacitor 110 according to the comparison result of the comparator 108 when the charging voltage exceeds the reference voltage VREF', and the voltage-frequency conversion apparatus 300 generates the frequency signal corresponding to the differential voltage between the voltage VIN(+) and the voltage VIN(−) by the comparator 108, and is characterized in that it comprises the reference voltage fluctuation unit 302 for making the reference voltage VREF' fluctuate. In this way, the frequency of the frequency signal output from the comparator 108 can be varied to the extent that interference is not subject to periodic digital noise such as the clock signal, etc., and voltage-frequency conversion accuracy can be improved.

The reference voltage fluctuation unit 302 makes the reference voltage VREF' fluctuate periodically within a predetermined range between the voltage V1 and the voltage V2. That is, the fluctuation range of the reference voltage VREF' can be constrained between the voltage V1 and the voltage V2 in advance. In other words, the level of the reference voltage VREF' fluctuates only within such a range that the frequency signal from the comparator 108 is not subject to interference from periodic digital noise such as the clock signal and thus the voltage-frequency conversion accuracy does not deteriorate as shown by the dot-and-dash line of FIG. 5. In this way, the voltage-frequency conversion accuracy can be improved. In particular, the reference voltage VREF' is preferably a voltage of a stepwise waveform ascending and descending repeatedly at the first cycle T1.

The reference voltage fluctuation unit 302 has the first reference voltage source 304 for generating the voltage V1; the second reference voltage source 306 for generating the voltage V2 smaller in voltage value than the voltage V1; the first capacitor 308; the second capacitor 310 with a capacitance smaller than that of the first capacitor 308; the first switch circuit (the first switch element 312 and the third switch element 316) for charging the first capacitor 308 by units depending on the capacitance of the second capacitor 310 so that its voltage ascends from the voltage V2 side to the voltage V1 side; the second switch circuit (the second switch element 314 and the third switch element 316) for discharging the first capacitor 308 by units depending on the capacitance of the second capacitor 310 so that its voltage descends from the voltage V1 side to the voltage V2 side; and the timing control circuit 318 for controlling the switch timings of the first switch circuit and the second switch circuit, and the reference voltage fluctuation unit 302 is configured to apply the charging/discharging voltage occurring at the one end of the first capacitor 308 to one terminal of the comparator 108 as the reference voltage VREF'.

More specifically, the reference voltage fluctuation unit 302 has the first reference voltage source 304 for generating the voltage V1; the second reference voltage source 306 for generating the voltage V2 smaller in voltage value than the voltage V1; the first capacitor 308; the second capacitor 310 with a capacitance smaller than that of the first capacitor 308; the first switch element 312 connected between the voltage V1 and the one end of the second capacitor 310 where a charging/discharging voltage occurs; the second switch element 314 connected between the voltage V2 and the one end of the second capacitor 310; the third switch element 316 connected between the one end of the first capacitor 308 where the charging/discharging voltage occurs and the one end of the second capacitor 310; and the timing control circuit 318 for controlling the switch timings of the first to third switch elements 312, 314, 316, the timing control circuit 318 complementarily switching the first switch element 312 and the second switch element 314 at the first cycle T1 while switching the third switch element 316 at the second cycle T2 shorter than the first cycle T1, and is configured to apply the charging/discharging voltage occurring at the one end of the first capacitor 308 to one terminal of the comparator 108 as the reference voltage VREF'.

The voltage-frequency conversion apparatus 300 may be incorporated in an integrated circuit (the microcomputer 203 or a logic circuit) operating in synchronization with a clock signal having a predetermined frequency. Since the frequency signal output from the voltage-frequency conversion apparatus 300 is hardly subject to the clock signal and periodic digital noise, the voltage-frequency conversion apparatus 300 can perform accurate voltage-frequency conversion even when installed in one-chip along with the microcomputer 203, the logic integrated circuit, etc.

Because the voltage VIN(+) and the voltage VIN(−) occur at both ends of the sensing resistor 202 through which the current of the secondary battery 201 flows, the microcomputer 203, etc., employing the voltage-frequency conversion apparatus 300 can accurately obtain the charging voltage when the secondary battery 201 is charged, the remaining voltage when the secondary battery 201 discharges, and the like.

Although the voltage-frequency conversion apparatus and method of generating the reference voltage of the voltage-frequency conversion apparatus of the present invention has been described, the description is for the purpose of facilitating the understanding of the present invention, rather than limiting the scope of the present invention. The present invention may variously be changed and altered without departing from the spirit thereof, and of course, the present invention includes equivalents thereof.

What is claimed is:

1. A voltage-frequency conversion apparatus having:
   a variable current source for charging a capacitor;
   a current amount adjustment unit that adjusts a current amount of the variable current source for charging the capacitor to be corresponding to a differential voltage between a first voltage and a second voltage;
   a comparator that compares in level a charging voltage produced at one end of the capacitor and a reference voltage;
   a discharge unit that discharges the charging voltage of the capacitor according to the comparison result of the comparator when the charging voltage exceeds the reference voltage; and
   a reference voltage fluctuation unit that makes the reference voltage fluctuate periodically within a predetermined voltage range, wherein the reference voltage fluctuation unit includes:
     a first voltage source for generating a voltage V1,
     a second voltage source for generating a voltage V2 smaller in voltage value than the voltage V1,
     a first capacitor,
     a second capacitor with a capacitance smaller than that of the first capacitor,
     a first switch circuit for charging the first capacitor by units depending on a capacitance of the second capacitor so that its voltage ascends from the voltage V2 side to the voltage V1 side,
     a second switch circuit for discharging the first capacitor by units depending on the capacitance of the second capacitor so that its voltage descends from the voltage V1 side to the voltage V2 side, and
     a timing control circuit that controls switch timings of the first switch circuit and the second switch circuit,
   wherein a charging/discharging voltage occurring at one end of the first capacitor is applied as the reference voltage to the comparator, wherein a frequency signal is generated from the comparator corresponding to the differential voltage between the first voltage and the second voltage, and wherein the reference voltage is a voltage with a stepwise waveform ascending and descending repeatedly at a cycle.

2. The voltage-frequency conversion apparatus of claim 1, which is incorporated in an integrated circuit that operates in synchronization with a clock signal having a predetermined frequency.

3. The voltage-frequency conversion apparatus of claim 1, wherein the first voltage and the second voltage are voltages occurring at both ends of a sensing resistor through which a current of a secondary battery flows.

4. A voltage-frequency conversion apparatus having:
  a variable current source for charging a capacitor;
  a current amount adjustment unit that adjusts a current amount of the variable current source for charging the capacitor to be corresponding to a differential voltage between a first voltage and a second voltage;
  a comparator that compares in level a charging voltage produced at one end of the capacitor and a reference voltage;
  a discharge unit that discharges the charging voltage of the capacitor according to the comparison result of the comparator when the charging voltage exceeds the reference voltage; and
  a reference voltage fluctuation unit that makes the reference voltage fluctuate periodically within a predetermined voltage range, wherein the reference voltage fluctuation unit includes:
    a first voltage source for generating a voltage V1,
    a second voltage source for generating a voltage V2 smaller in voltage value than the voltage V1,
    a first capacitor,
    a second capacitor with a capacitance smaller than that of the first capacitor,
    a first switch element connected between the first voltage source and one end of the second capacitor at which a charging/discharging voltage occurs,
    a second switch element connected between the second voltage source and the one end of the second capacitor,
    a third switch element connected between one end of the first capacitor at which a charging/discharging voltage occurs and the one end of the second capacitor, and
    a timing control circuit that controls switch timings of the first to third switch elements,
  wherein the timing control circuit complementarily switches the first switch element and the second switch element at a first cycle while switching the third switch element at a second cycle shorter than the first cycle,
  wherein the charging/discharging voltage occurring at the one end of the first capacitor is applied as the reference voltage to the comparator,
  wherein a frequency signal is generated from the comparator corresponding to the differential voltage between the first voltage and the second voltage, and
  wherein the reference voltage is a voltage with a stepwise waveform ascending and descending repeatedly at a cycle.

5. The voltage-frequency conversion apparatus of claim 4, which is incorporated in an integrated circuit that operates in synchronization with a clock signal having a predetermined frequency.

6. The voltage-frequency conversion apparatus of claim 4, wherein the first voltage and the second voltage are voltages occurring at both ends of a sensing resistor through which a current of a secondary battery flows.

* * * * *